(12) United States Patent
Schneider et al.

(10) Patent No.: US 10,485,092 B2
(45) Date of Patent: Nov. 19, 2019

(54) MULTILAYER BUS BOARD

(71) Applicants: Richard Schneider, Livonia, MI (US); Joseph J. Lynch, East Northport, NY (US); INTERPLEX INDUSTRIES, INC., College Point, NY (US)

(72) Inventors: Richard Schneider, Livonia, MI (US); Joseph J. Lynch, East Northport, NY (US)

(73) Assignee: INTERPLEX INDUSTRIES, INC., East Providence, RI (US)

( * ) Notice: Subject to any disclaimer, the term of this patent is extended or adjusted under 35 U.S.C. 154(b) by 0 days.

(21) Appl. No.: 15/552,116

(22) PCT Filed: Feb. 16, 2016

(86) PCT No.: PCT/US2016/018000
§ 371 (c)(1),
(2) Date: Aug. 18, 2017

(87) PCT Pub. No.: WO2016/133861
PCT Pub. Date: Aug. 25, 2016

(65) Prior Publication Data
US 2018/0049310 A1    Feb. 15, 2018

Related U.S. Application Data

(60) Provisional application No. 62/153,710, filed on Apr. 28, 2015, provisional application No. 62/117,705, filed on Feb. 18, 2015.

(51) Int. Cl.
*H05K 1/02* (2006.01)
*H02G 5/00* (2006.01)
(Continued)

(52) U.S. Cl.
CPC ......... *H05K 1/0209* (2013.01); *H01R 12/526* (2013.01); *H02G 5/005* (2013.01);
(Continued)

(58) Field of Classification Search
CPC ...... H01R 12/526; H05K 1/18; H05K 1/0209; H05K 3/4679; H05K 3/429;
(Continued)

(56) References Cited

U.S. PATENT DOCUMENTS 3,555,293 A * 1/1971 Shannon ................ H02G 5/007
174/68.3
4,208,080 A * 6/1980 Teagno ................ H01R 12/523
29/830
(Continued)

FOREIGN PATENT DOCUMENTS

CN     101325182 A    12/2008
CN     104347966 A    2/2015

OTHER PUBLICATIONS

European Search Report and Written Opinion, dated Sep. 21, 2018, from counterpart EPO application No. 16752876.9, filed Aug. 21, 2017.
(Continued)

*Primary Examiner* — Hoa C Nguyen
(74) *Attorney, Agent, or Firm* — Preti Flaherty Beliveau & Pachios LLP

(57) ABSTRACT

A multilayer bus board comprising a multilayer stacked assembly including a plurality of electrically conductive first layers, and at least one second dielectric layer disposed between adjacent first layers; and a frame formed of a dielectric material, the frame encapsulating at least a portion of the multilayer stacked assembly and mechanically maintaining the first and second layers in secure aligned abutting relation.

20 Claims, 17 Drawing Sheets

(51) Int. Cl.
*H01R 12/52* (2011.01)
*H05K 3/42* (2006.01)
*H05K 3/46* (2006.01)
*H05K 1/18* (2006.01)

(52) U.S. Cl.
CPC .............. *H05K 1/18* (2013.01); *H05K 3/429* (2013.01); *H05K 3/4679* (2013.01); *H05K 2201/01* (2013.01); *H05K 2201/0323* (2013.01); *H05K 2201/10242* (2013.01); *H05K 2201/10303* (2013.01); *H05K 2201/2018* (2013.01)

(58) Field of Classification Search
CPC ....... H05K 2201/01; H05K 2201/2018; H05K 2201/0323; H05K 2201/10242; H05K 2201/10303; H02G 5/005
See application file for complete search history.

(56) References Cited

U.S. PATENT DOCUMENTS

| | | | |
|---|---|---|---|
| 4,503,484 A | 3/1985 | Moxon | |
| 4,845,592 A | 7/1989 | Himes, Jr. et al. | |
| 5,185,690 A | 2/1993 | Miller | |
| 5,456,608 A * | 10/1995 | Rogers | H01R 29/00 29/845 |
| 2004/0001319 A1* | 1/2004 | Kawakita | H05K 1/0263 361/715 |
| 2004/0184244 A1* | 9/2004 | Uezono | B60R 16/0238 361/748 |
| 2008/0308305 A1* | 12/2008 | Kawabe | H01L 23/49833 174/255 |
| 2009/0091897 A1 | 4/2009 | Willing et al. | |
| 2012/0257324 A1 | 10/2012 | Ma et al. | |
| 2015/0014453 A1* | 1/2015 | Sly | B01F 3/1221 241/15 |
| 2015/0035496 A1 | 2/2015 | Kikuchi | |
| 2015/0037662 A1* | 2/2015 | Pinon | H01M 2/0237 429/179 |
| 2016/0271132 A1* | 9/2016 | Hampson | A61K 9/0034 |

OTHER PUBLICATIONS

Chinese Office Action and Search Report, dated Jul. 15, 2019, for related Chinese patent application 2016/80017386.4, filed on Feb. 16, 2016. Original and translation.

* cited by examiner

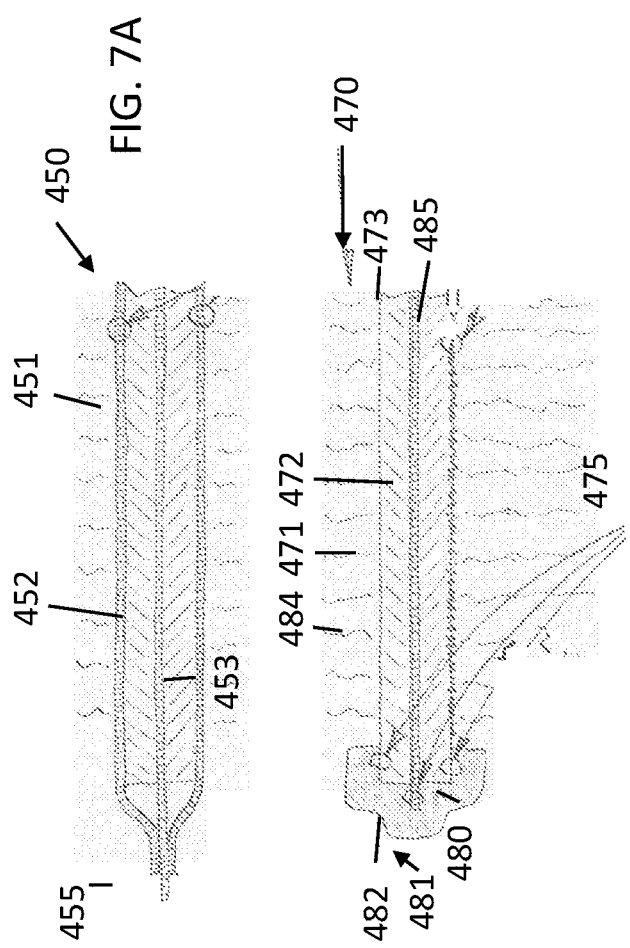

MULTILAYER BUS BOARD

CROSS REFERENCE TO RELATED APPLICATIONS

This application claims the priority of U.S. Provisional Application No. 62/117,705 filed Feb. 18, 2015 entitled, MULTILAYER BUS BOARD HAVING A MOLDED FRAME. This application also claims the priority of U.S. Provisional Application No. 62/153,710 filed Apr. 28, 2015 entitled, MULTILAYER BUS SYSTEM. Each of the above listed earlier applications is hereby incorporated by reference herein.

FIELD OF THE INVENTION

The present invention relates to multilayer bus boards and more specifically to multilayer bus boards assemblies that contain a dielectric insulator coating or film between conductive layers and are mechanically held together by a molded frame or medium that at least partially encapsulates or holds the assembly in place.

BACKGROUND OF THE INVENTION

Multilayer bus bars and bus boards (hereinafter referred to as "multilayer bus boards") have been routinely employed in electrical devices for power and signal distribution and take many different forms. Some bus boards known in the art employ a laminated construction in which conductive plates or layers are insulated from adjacent conductive layers by a dielectric layer disposed therebetween.

In one known construction, a multilayer sandwich is encapsulated in a solidifiable dielectric medium. Apertures are provided through the encapsulated structure and conductive pins or posts are driven through the structure so as to make electrical contact with, and electrically interconnect the stacked conductive plates. Such a structure is disclosed in U.S. Pat. No. 4,133,101. Other encapsulated multilayer bus bar and bus board structures are disclosed, for example, in U.S. Pat. No. 7,977,777 and US Published Application 2014/0185195. A method of forming a molded condenser is disclosed in U.S. Pat. No. 1,871,492.

In certain applications it is desirable to make connection via a pin or terminal to one or more conductive layers of a multilayer bus board without making conductive contact with other layers of the multilayer bus board. In one construction in which the bus board is formed as an alternating sandwich of conductive and dielectric layers, openings are provided that are oversized in relation to a pin that will extend through the bus board and an insulating donut or sleeve is disposed in the opening prior to lamination of the layers to form the bus board. These dielectric layers are typically film based with epoxy based coatings that are used as bonding agents to the multiple conductive layers. When the pin is urged through the bus board, it makes contact with conductive layers that do not include such a sleeve and is insulated from layers containing such a sleeve. In these type of constructions epoxy coated dielectrics are typically covering at least most of the complete conductive layers because of the need for mechanical strength. This coating can restrict heat dissipation that is needed in certain high power switching circuits. Assembly of a multilayer bus board in this manner involves selective placement of the insulating sleeves within specified openings of the conductive layers. This procedure as well as setting times of the epoxy based dielectrics can be time consuming in the manufacturing process, costly and volume restrictive. It would therefore be desirable to have a bus board and method for producing the same core construction that allowed for high volume production, permitted interconnection of terminals or pins, was able to be designed to allow for heat dissipation, able to add features of topography for locational and mechanical holding and add dielectric insulator via holes as needed without added parts to selected layers of the multilayer bus board.

These prior art systems typically use metal powder coating or epoxy based lamination insulators and additional insulators in the form of inserts to create pass through channels for conductors to get to the adjacent layers. The lamination process to put this all together is similar to lamination of PCBs, and take up to 40 minutes to an hour for the lamination process. The end product can be bent and formed but is featureless with regards to locaters, boltthroughs, etc.

To avoid high inductance, bus conductors need to be electrically balanced so that current flows equally and in the opposite direction through each adjacent conductive sheet. When so connected, their opposing fields will effectively cancel each other. The closer the conductors are together, the greater this cancellation effect. Therefore, the dielectric material selected should be as thin as possible while still having a dielectric strength appropriately in excess of the application voltage, resulting in little added circuit inductance. Closer, thinner, and wider conductors are the key to reducing total circuit inductance getting maximum performance. Another prior art approach is just to put two copper sheets in a molding process and hold them apart an allow plastic to flow between them. This approach may be insufficient for today's technology as the industry requires very thin bus layers. Thin gaps between the opposing potentials with high dielectric between the layers keeps inductance low as switching speeds rise. Larger spacing and thick bus layers generate higher inductance as with the laminated approach.

There is also a growing need to move to very high temperatures (greater than 250 C) because of the higher chip temperatures, however many current lamination materials have trouble at higher temps, which creates additional problems to solve.

With power density growth, multilayer bus board assemblies need to become more compact. There is a need to connect subassemblies within various power assemblies and modules in a mechanically condensed and electrically efficient manner. High voltage assemblies up to but not limited to 1200 volts need opposite polarity conductive planes between subassemblies that are compact, deploy shapes and location features so that subassemblies and parts can be nested together in one assembly with one common power plane. In the application case of high power switching circuits like insulated-gate bipolar transistors (IGBTs) these power planes need to support high capacitance with low inductance so as not to cause overvoltage which would adversely affect switching speeds.

SUMMARY OF THE INVENTION

According to embodiments of a first aspect of the invention can include any one or a combination of the following features which address many of the shortcomings of prior approaches to multilayer bus systems:

Efficient higher throughput manufacturing methods compatible for high volume and lower costs;

Multilayer bus boards which provide external topographies and features that allow for better location and nesting for joining of subassemblies into common bus structure;

Elimination of excess parts like internal insulators for creating insulated holes, standoffs for mounting harnesses and interconnecting or other types of hardware;

Use of selective mechanical joining areas opening up bus bar areas that allows for better heat dissipation and provides a more feature rich product;

Multilayer bus board designs which promote efficiency with shorter, wider and balanced current paths, with close proximity of opposite buses for lower overall inductance; and Which can incorporate active components on layers or between layers of the bus using the molded dielectric material as an insulator and component holder or locator.

A second aspect of the present invention includes a multilayer bus board comprising: a multilayer stacked assembly including a plurality of electrically conductive first layers, and at least one second dielectric layer disposed between adjacent first layers; and a frame formed of a dielectric material, the frame encapsulating at least a portion of the periphery of the multilayer stacked assembly and mechanically maintaining the first and second layers in secure aligned abutting relation.

Embodiments of the second aspect of the invention can include any one or a combination of the following features:

The first layers have a length, width and thickness, with electricity flowing through each first layer along the length and through an area defined by the width and thickness of the first layer, and wherein the thickness is in the range of 0.25 to 0.6 mm and the ratio of width to thickness is greater than 200:1.

The electricity flows through adjacent first layers in opposite directions and wherein the adjacent first layers are positioned less than 0.3 mm apart from each other.

The operational voltage is greater than 25 Volts and extends to about 4000V.

A further aspect of the present invention is that the multilayer bus board must include at least two layers and in an aspect there are more than two first layers.

The second dielectric layer includes a peripheral end portion, and the peripheral end portion extends outward of each adjacent first layers, and the peripheral end portion of the second dielectric layer extends into the frame.

In an aspect of the invention, the multilayer stack assembly periphery comprises nonlinear undulations, wherein said frame covers at least a portion of the nonlinear undulations.

In an aspect of the invention, the multilayer stacked assembly includes a through hole; the through hole positioned and configured in a conductive portion of a first one of the plurality of first layers, and sized for electrical mating interconnection with a conductive contact when the conductive contact is disposed through the through hole; the multilayer stacked assembly including an oversized opening in a conductive portion of a second one of the first layers in alignment with the through hole, and the frame includes at least one dielectric sleeve disposed in the oversized opening of at least one of the first layers and formed as a one piece integral part with the frame the sleeve having a sleeve opening aligned with the through hole, so as to insulate the conductive contact from the conductive portion of the second one of the first layers when the conductive contact is disposed through the through hole in the multilayer stacked assembly.

In an aspect of the invention, the multilayer stack assembly further includes at least one penetration extending through said assembly, wherein said frame extends through the penetration to mechanically maintain the first and second layers in secure aligned abutting relation.

In an aspect of the invention, at least one of the external layers of the multilayer stack assembly are conductive first layers, and each first layer has an internal surface adjacent a dielectric second layer.

In an aspect of the invention, each of the external layers of the multilayer stack assembly are conductive first layers, and each first layer has an internal surface adjacent a dielectric second layer, and an external surface with comprises an external surface of the multilayer stack assembly.

In an aspect of the invention, at least one of the external surfaces of an external layer is surface treated to increase surface emissivity, and/or at least one of the external surfaces of an external layer is coated with carbon to increase heat dissipation.

In an aspect of the invention, the multilayer bus board can further include an adhesive which is positioned adjacent the extending portion of the second layer, and wherein said adhesive acts to enhance adhesion between the first layer and the frame.

In an aspect of the invention, the frame includes topographical features selected from a group comprising standoffs, locating features, and bolt to features, and combinations thereof.

In an aspect of the invention, the multilayer bus board can further comprise an electrical component, wherein said electrical component is selected from a group comprising: an ammeter shunt, thermistor, diode, sensor, current sensor, resistor, capacitor and combinations thereof, wherein the electrical component is positioned adjacent a through hole, and is insulated relative the multilayer stack assembly by the frame, wherein said electrical component comprises at least two contact leads and wherein each contact lead is electrically connected to different first layers.

In an aspect of the invention, the frame extends to include a dielectric sleeve which is positioned adjacent an external surface of the multilayer stack assembly, further comprising an electrical component, wherein the electrical component is insulated relative the multilayer stack assembly by the dielectric sleeve, wherein the electrical component comprises at least two contact leads and wherein each contact lead is in physical contact with different first layers of the multilayer stacked assembly.

In an aspect of the invention, a first one of the plurality of first layers extends outward from the multilayer stack assembly to provide a spring contact for at least one of said electrical component leads.

In an aspect of the invention, a first one of the plurality of first layers extends outward from the multilayer stack assembly to provide an external electrical contact for at least one of said electrical component leads.

In an aspect of the invention, the frame extends to include a dielectric sleeve which is positioned adjacent an external surface of the multilayer stack assembly, wherein a first one of the plurality of first layers extends outward from the multilayer stack assembly to provide an external electrical contact, wherein the multilayer bus board further comprises an electrical component, wherein the electrical component is positioned adjacent the dielectric sleeve, and is insulated relative to the multilayer stack assembly by the dielectric sleeve, wherein said electrical component comprises first and second contact leads and wherein the first contact lead is in physical contact with the external surface and the second contact lead is in physical contact with the first one of the plurality of first layers of the multilayer stacked assembly.

In an aspect of the invention, the multilayer bus board further includes a component with at least two leads, wherein the component can be attached between the two adjoining first layers by leads that are shaped or formed out of the planes of the first layers to make mechanical contact to the leads of the component.

These and other features, advantages, and objects of the present invention will be further understood and appreciated by those skilled in the art by reference to the following specification, claims, and appended drawings.

BRIEF DESCRIPTION OF THE DRAWINGS

In the drawings:

FIG. 7A shows a prior art crimped edge;

FIG. 7B shows a portion of a multilayer stacked assembly of the present invention;

DETAILED DESCRIPTION OF THE PREFERRED EMBODIMENTS

Figure 1:
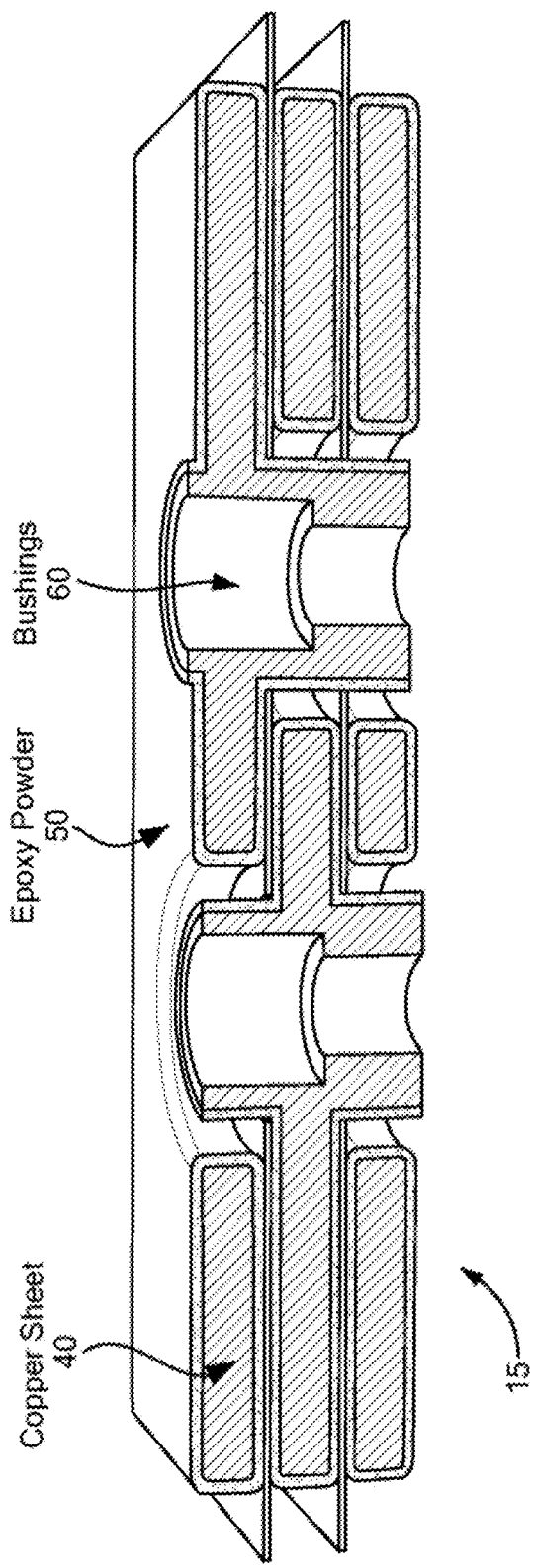
FIG. 1 comprises a cross-sectional view of a prior art laminated bus board.

Referring to FIG. 1, a cross-sectional view of the prior art laminated bus board 15 is shown with three copper sheets 40 disposed in parallel with epoxy powder based laminated film layers 50 interposed between each copper sheet 40 and covering both external surfaces of the copper sheets 40. Bushings 60 are interposed and act to insulate the through holes in the multilayer bus board 15.

The epoxy based laminated film is used as a dielectric insulator for the copper sheets and is bonded onto the desired surfaces in a lamination press that typically takes at least thirty (30) minutes. The bushings are inserted and used as insulators for the through holes. Standoffs, locating features or insulators are thus secondary additions to the prior art multilayer bus board 15 and can be mounted on the multilayer bus board via the through holes.

Figure 2B:
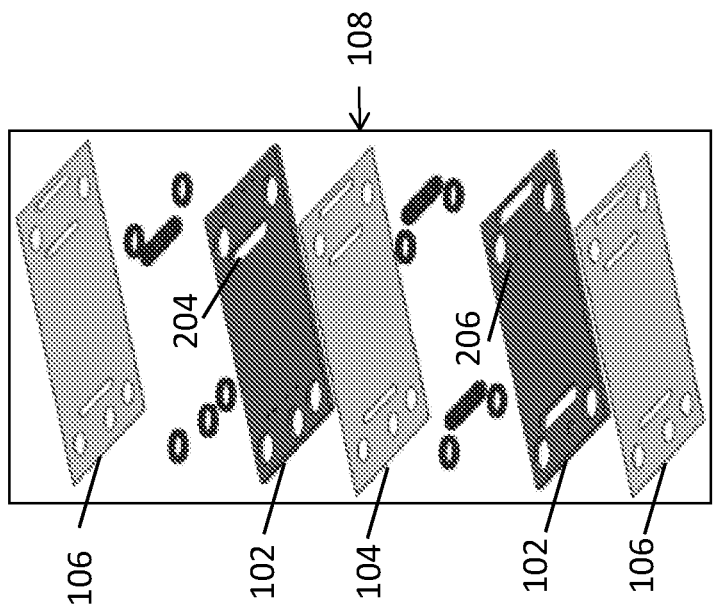
FIG. 2B an exploded view of a portion of the bus board of FIG. 2A.
Figure 2A:
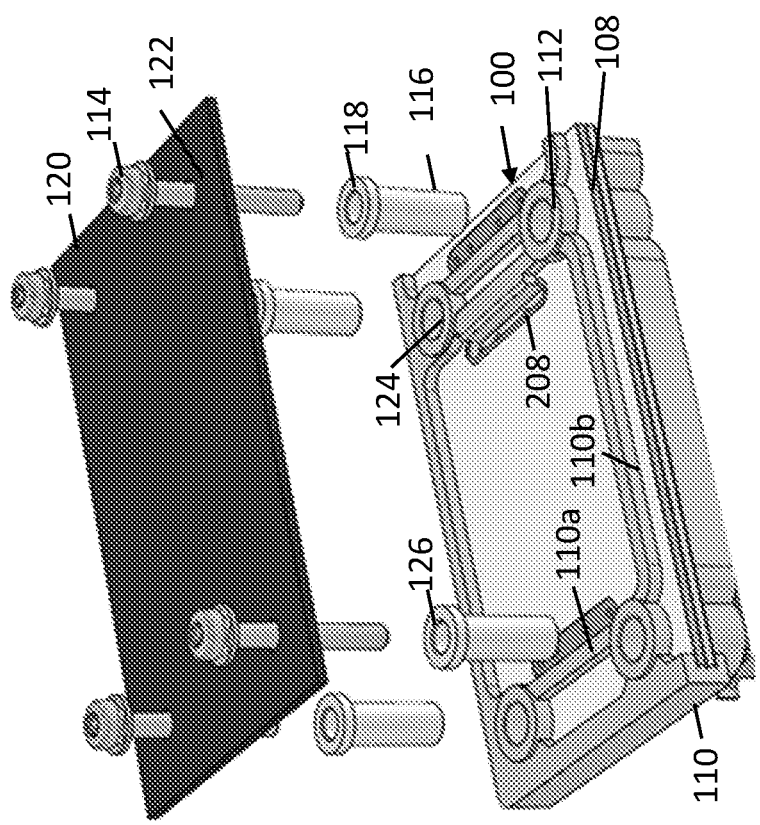
FIG. 2A is a partially exploded view of a bus board assembly of the present invention.
Figure 2C:
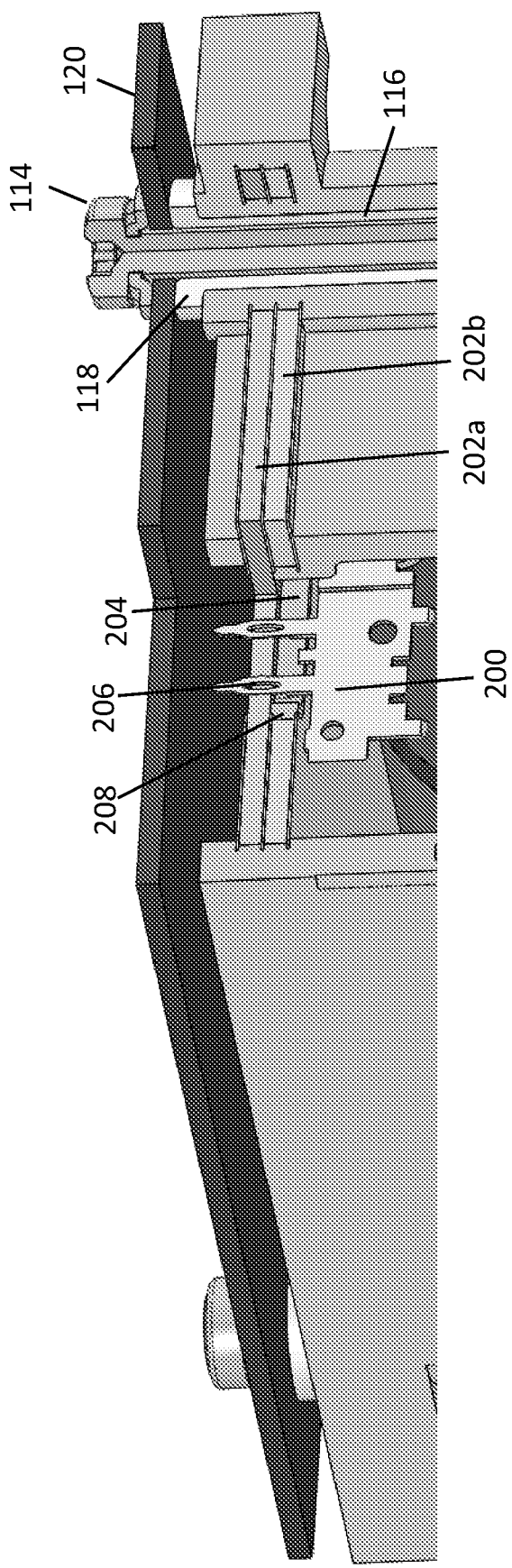
FIG. 2C is a cross-sectional view of the bus board of FIG. 2A.

In accordance with the invention, a multilayer bus board is disclosed. Referring to FIGS. 2A, 2B, and 2C, and specifically FIG. 2B, the multilayer bus board 100 includes a multilayer stacked assembly 108 which includes a plurality of conductive plates or layers 102 with a dielectric layer 104 disposed between adjacent conductive layers 102. For example, the conductive plates or layers 102 may be provided as copper layers which are highly conductive or any other suitable highly conductive material. Dielectric layers 106 may optionally be disposed on either side of the outer conductive layers 102. Collectively, the conductive layers 102, dielectric layers 104 and the outer dielectric layers 106 (if present) form the multilayer stacked assembly 108.

The dielectric layers 104, 106 may be provided in the form of paper layers, polymeric films, e.g. thermoplastic films, ceramic woven fibers, cellulitic films, Nomex® or any other suitable dielectric sheet material having suitable dielectric properties for the application. By way of example, and not limitation, dielectric layers may be paper having a thickness in the range of 0.127 mm to 0.3 mm, recognizing that other thicknesses of the dielectric layers may be desirable based on the specific application and it may be desirable for certain dielectric layers to have different thicknesses and dielectric properties from other dielectric layers in the multilayer stacked assembly. The dielectric layers are distinct layers from adjacent conductive layers.

An exemplary bus board 100 produced in accordance with the present disclosure as shown in FIG. 2 includes 2 conductive layers. It should be recognized however, that a bus board produced in accordance with the present disclosure may include 2, 3, 4 or more conductive layers 102 with dielectric layers 104 disposed therebetween.

A molded frame 110 mechanically maintains the multilayer stacked assembly and adjacent conductive layers 102 and the dielectric layers 104 and 106 in secure aligned stacked arrangement. The frame may be molded of any suitable moldable or cured dielectric material, such as a thermoplastic, thermoset epoxy or other material that mechanically maintains the multilayer stacked assembly in secure aligned arrangement. The frame 110 may include legs or web-like members 110a, 110b integral with the frame 110 that serve to maintain the layers 102, 104 and 106 in a tightly stacked arrangement in areas away from the periphery of the assembly 108. It is preferred that the frame be formed (via molding) over the assembly, however in an aspect of the invention, the frame can be premolded and then secured over the assembly in a subsequent step.

Since the multilayer stacked assembly 108 is secured mechanically by the frame 110, there is no need for adhesives, lamination or bonding processes as are employed in conventional laminated bus boards. Additionally, in the process of molding or setting the frame 110, the frame material adheres to the edges of the dielectric layers 104, 106. Good adhesion of the plastic frame 110 to the dielectric layers 104, 106 provides beneficial insulation around the periphery of the conductive layers and thereby improves the creep distance at the edges of the assembly 108. The production of bus boards in the presently described manner is particularly suitable for high volume production processes. Additionally, the presently disclosed molded multi-layer bus board may utilize very thin dielectric sheets or films so as to permit conductive layers to be stacked in close proximity while maintaining electrical isolation there between. More specifically, closely spaced current paths or planes of opposed layers separated by a thin dielectric and wider current paths result in a lower inductance, faster switching speeds and more rapid heat dissipation. Such a construction improves electrical efficiency in high speed electrical circuits, e.g. high speed switching circuits as employed in inverters, switching power supplies, etc.

Electrical connections may be made to respective conductive layers 102 of the assembly via the use of conductive press fit pin, high normal force connectors or any other suitable conductive terminal (hereinafter "conductive contact") that is urged through openings in the multilayer stacked assembly 108 as shown in FIG. 2C. If it is desired to have a conductive contact 200 pass through one or more conductive layers 102 and conductively interconnect with a selected conductive layer 202a while not making an electrical connection with another layer 202b, an oversized opening 204 is provided in the layer 202b through which the conductive contact 200 is to pass without making an electrical interconnection. A smaller contact receiving opening 206 is provided in a conductive layer 202a that is sized for a press fit electrical interconnection with the conductive contact 200. More specifically, the contact receiving opening 206 is sized so that the conductive contact 200 abuts the walls of the contact receiving opening 206 and thereby electrically interconnects the conductive contact 200 to the respective conductive layer 202a when the conductive contact 200 is urged through the multilayer stacked assembly 108.

The frame 110 of a dielectric material is molded or set around the periphery of the bus board 100. When molding the frame 110, insulating sleeves 208 may be formed as an integral part of the molded frame 110 within the oversized openings 204 so as to prevent the conductive contacts 200 from making electrical contact with layer 202b (FIG. 2C). The sleeves 208 are molded as a one-piece integral part of the frame 110. Depending on the location of a sleeve 208, the sleeve may connect to the peripheral portion of the frame via legs or web-like members extending from the peripheral portion of the frame. The sleeves 208 may be circular, configured to surround elongated slots as illustrated, or may be of any other desired shape to accommodate desired configurations of conductive contacts 200 while insulating the contacts 200 from the applicable conductive layer.

The sleeves 208 may extend inward from either side of the multilayer stacked assembly 108. Additionally, it should be appreciated that oversized openings may be provided in plural adjacent layers extending from either side of the multilayer stacked assembly with insulating sleeves molded therein to provide insulation of a conductive contact from one or more in a multilayer stacked assembly. Dielectric layers from an outer dielectric layer to at least the conductive layer to be insulated from the conductive contact also include an oversized opening to allow the molded sleeve to extend through all conductive layers to be insulated from the conductive contact 200. The dielectric layer between the conductive layer 202a making contact with the conductive contact 200 and the conductive layer 202b that is insulated from the conductive contact 200 may optionally include an oversized opening as shown with respect to layer 104 in FIG. 2B.

The frame 110 may be provided with bushing receiving openings 112 for fasteners 114. The fasteners 114 may be used to mount a cover or circuit board 120 over the bus board 100 and may be secured to a structure disposed below the bus board 100 or to the frame 110, depending upon the application.

As shown in FIG. 2A, bushings 116, which are illustrated as generally cylindrical bushings having a cylindrical flange 118 at one end, are insertable into bushing receiving openings 112. Alternatively, the bushings 116 may be insert molded during the molding process. The bushings 116 may be metal or any other suitable material to avoid stressing the bus board 100 upon tightening of the fasteners 114. Fasteners 114 may be disposed through openings 122 in the cover or circuit board 120 and through the bushings 116. The height of the flange 118 is specified so as to provide sufficient spacing between the cover or circuit board 120 and the adjacent surface of the multilayer stacked assembly 108 to accommodate tails of conductive contacts 200 that extend through the upper surface of the stacked layer assembly 108. Additionally, when a circuit board is mounted adjacent the bus board, the spacing between the bus board and the circuit board must be sufficient to prevent arcing between tails of conductive contacts traces, conductors on the circuit board or components mounted thereto. The upper periphery 124 of the bushing receiving openings 112, the upper portion 126 of the flange 118 of bushing 116 and/or the lower periphery of the bushing receiving opening may optionally be formed as a concave seat (not shown) to accommodate an elastomeric O-ring so as to provide vibration and stress relief for the bus board 100 following mounting of the same.

Figure 3:
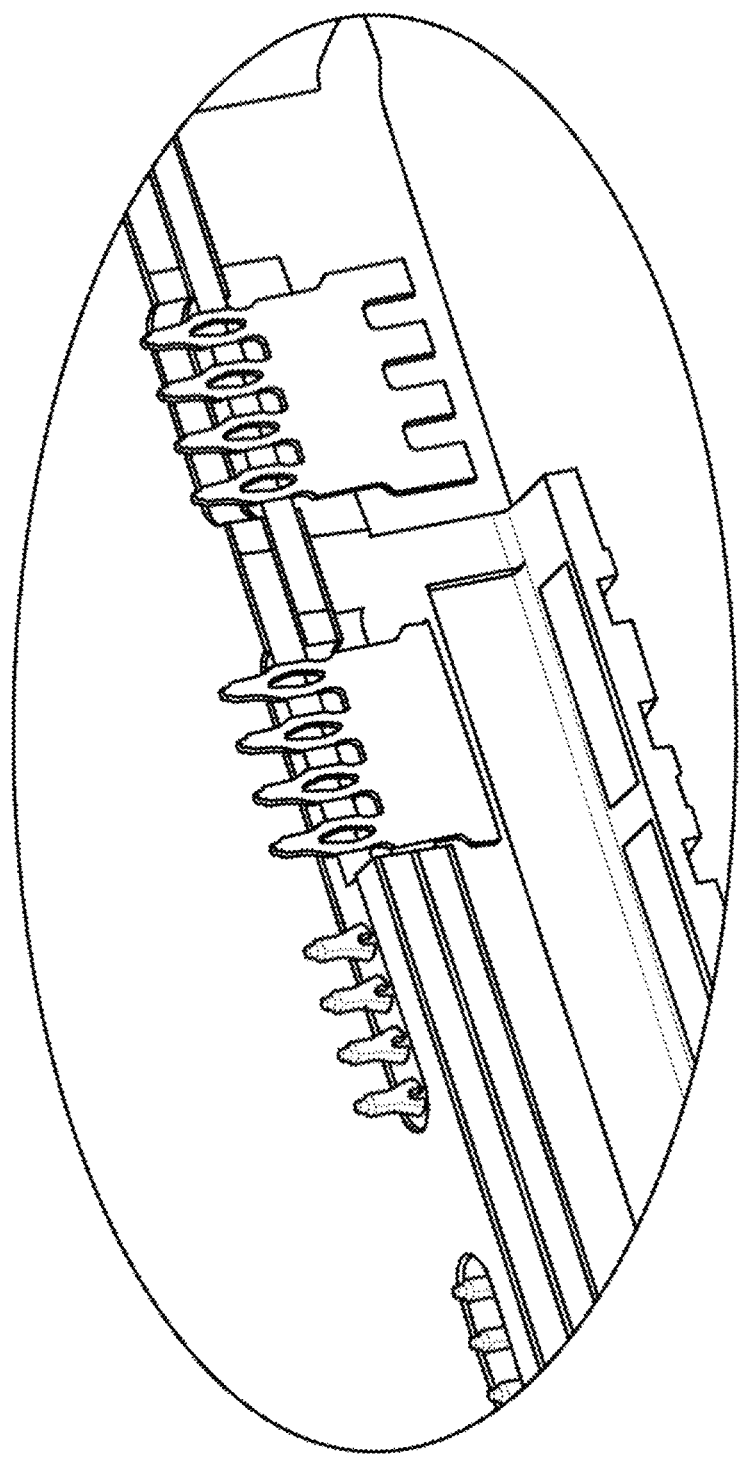
FIG. 3 is a cutaway perspective view illustrating the use of molded portion integral with the frame to create insulated pass through holes in a multilayer bus board construction in accordance with the present invention.

While the above-described assembly has been discussed with respect to the interconnection of a single conductive contact with a conductive layer in which the conductive contact is insulated from one or more other conductive layers via molded sleeves formed in the molding of the frame 110, gangs of conductive contacts (as shown in FIG. 3), may similarly be conductively connected to conductive traces or planes of one or more layers while being insulated from conductive traces or planes on one or more other layers via the use of insulated sleeves formed in the process of the molding of the frame. The use of molded features which are components of the molded leadframe to create insulated pass through holes into adjacent layers is a design benefit of the present invention. The molded multilayer bus board also allows for additional layer stacking beyond two layers as desired and needed, whereas lamination is restrictive of layer number due to process timing to activate adhesion in the lamination process.

Some of the benefits of the present invention include significant cost reduction, improved mechanical and electrical performance. The quick insert mold cycle time relative the long lamination time is a cost and time saver. The costly PEN/epoxy film can be replaced with a relatively common, low-cost Nomex® or similar insulator. The threaded inserts and rubber washers can be eliminated. In addition, much greater bolting forces can be used on the bus board with less shrinkage error and smaller stacked heights and sizes. For fast switching circuits like IGBTs, stray inductance in bus board circuits can cause overvoltage which adversely affects switching speeds. Finally, as mentioned the thin insulator allows for conductive layers that are stacked in relatively close proximity, as small as 0.127 mm, and preferably equal to or less than 0.3 mm, and most preferably equal to or less than 0.2 mm, to each other which maintaining electrical insulation which improves electrical efficiency.

Figure 4C:
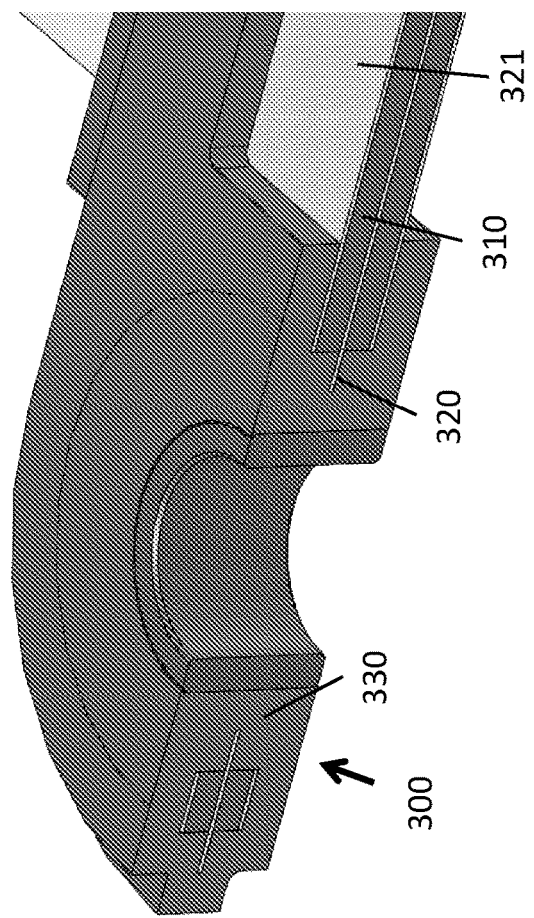
FIG. 4C is a cross-sectional view of the bus board of FIG. 4A.
Figure 4B:
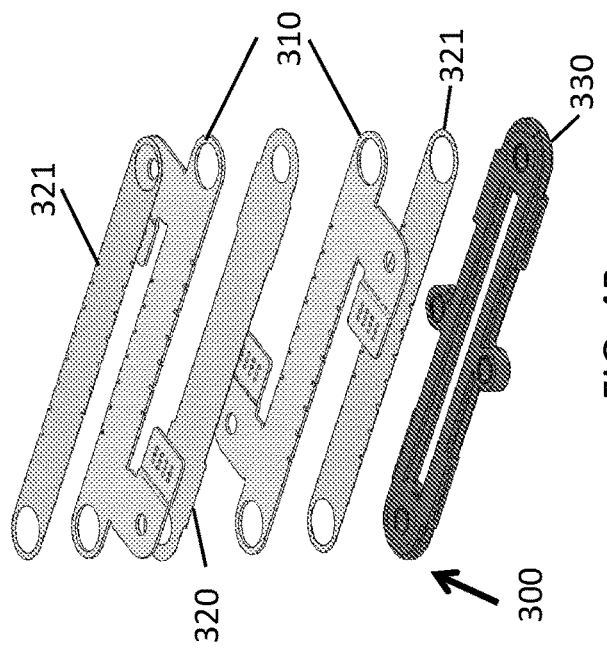
FIG. 4B an exploded view of the bus board of FIG. 4A.
Figure 4A:
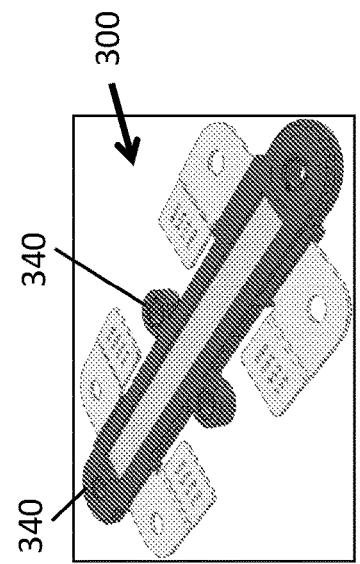
FIG. 4A is a perspective view of a bus board assembly of the invention.

Referring now to FIGS. 4A, 4B, and 4C, there is shown three descriptive images of the inventive multilayer bus board 300. Multilayer bus board 300 comprises three basic, components which adds to simplicity and which reduces cost: The two conductive sheets 310 which can be stamped or otherwise formed, and in one embodiment comprised of copper such as 1 mm thick C11H02 copper sheet or other conductive material, and electrolytically post plated (tin over nickel) to reduce environmental corrosion; The dielectric layer 320 disposed and interposed between the conductive sheets 310, can be comprised of thin insulative paper which can be cut into the desired shape. End dielectric layers 321 can also be included to insulate the outer surfaces of the conductive sheets 310; and finally the multilayer conductive-dielectric is secured by an overmold 330 which can comprise an insulative thermoplastic such as polyphthalamide (PolyOne PPA35GF) or other resin. Although, the overmold frame 330 is shown as a separate formed component in the explode view FIG. 5B it is preferably formed over the multilayer stacked assembly via a conventional plastic molding operation (melt temperature 325 C, and mold temperature 90 C). The overmold adheres to the dielectric layer providing additional thermal and vibration shock resistance. The overmold can also provide multiple openings 340 for securing the multilayer bus board to other components or other fixtures. The multilayer bus board 300 provides a design that does not require edge crimps (as will be described in more detail below) or secondary epoxy filling for creep requirements. The plastic although thermoplastic in this example, is no limited as long as the material meets the dielectric requirements of an insulator and the mechanical requirements set forth in this Application. Thermoset materials can be used and may be preferred as temperatures requirements rise. Higher temperature thermoplastics like liquid crystal polymers (LCPs) or Polyether ether ketone (PEEKs) may be preferred if temperature demand require their associated temperature resistance. The overmold frame 330 encapsulates the conductive layers and the dielectric layers including the portions of each dielectric layer which extends outward past the adjacent edge of each conductive layer. Typical operational voltage is about 450V to 600V. However, design alternatives described herein can withstand voltages as high as 4,000V.

Figure 5A:
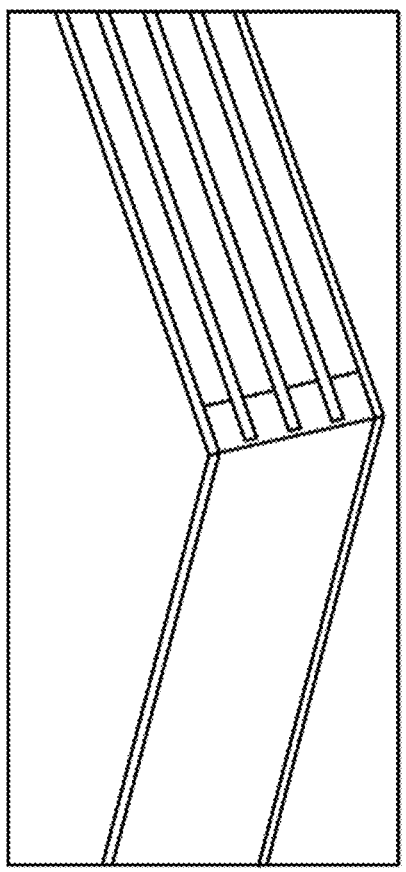
FIG. 5A shows a prior art crimped edge.
Figure 5B:
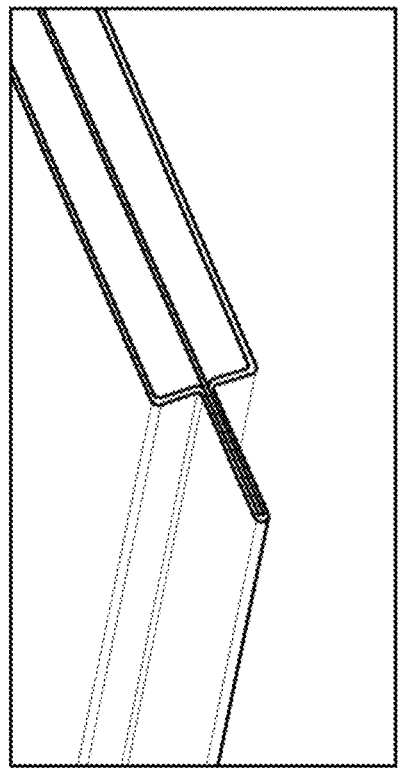
FIG. 5B shows a prior art epoxy filled edge.

Referring to FIGS. 5A and 5B there is shown two prior art methods of managing creep in bus bar designs. As dielectric layers are interposed between or are positioned adjacent end layers of conductive material, the dielectric layer is typically sized such that its edges extend past the adjacent conductive layer edge. This extending portion then needs to be managed so that creep between conducting layers is prevented. In FIG. 5A, there is shown a first prior art method which requires a separate manufacturing step of crimping the extending portions onto each other so that they remain coherent during the life of the bus board (all extending portions crimped centrally). In FIG. 5B, there is shown a second prior art method requiring the additional step of applying epoxy to the bus board edge so as to encapsulate the extending dielectric portions to render them coherent. Both of these prior art methods require additional manufacturing steps and additional parts which add to both the length and cost of the prior art laminated bus board manufacturing designs.

Figure 6A:
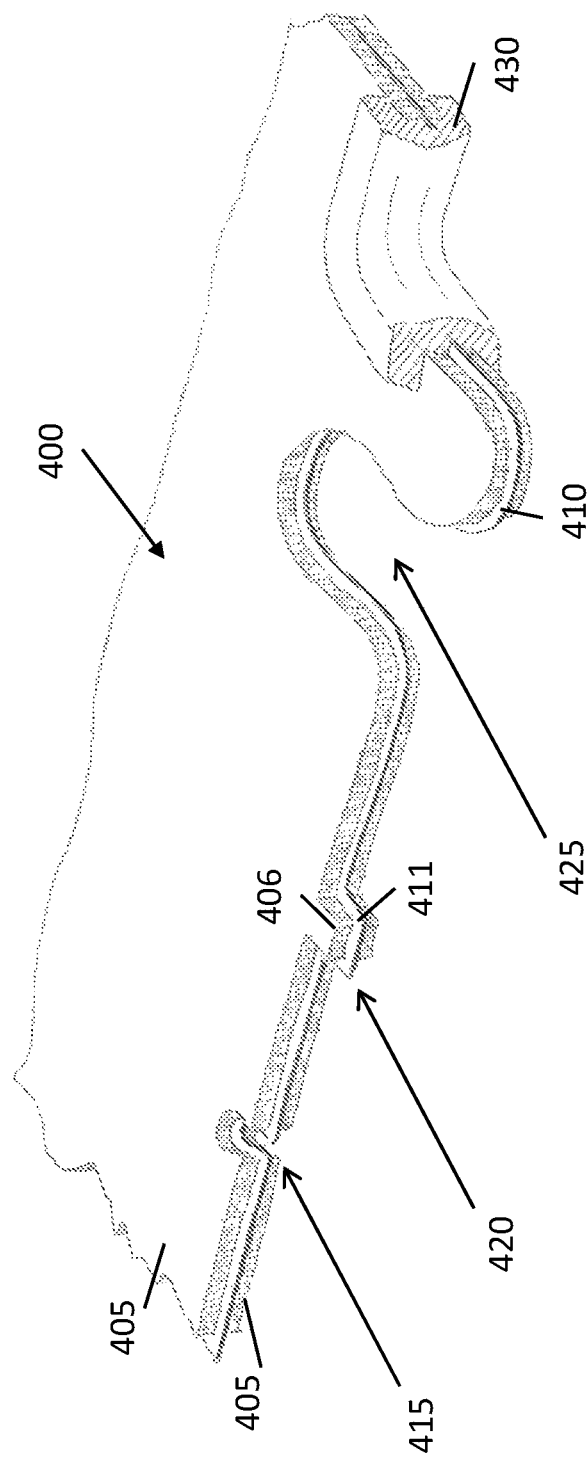
FIG. 6A shows an edge portion of the multilayer bus board of the invention.
Figure 6B:
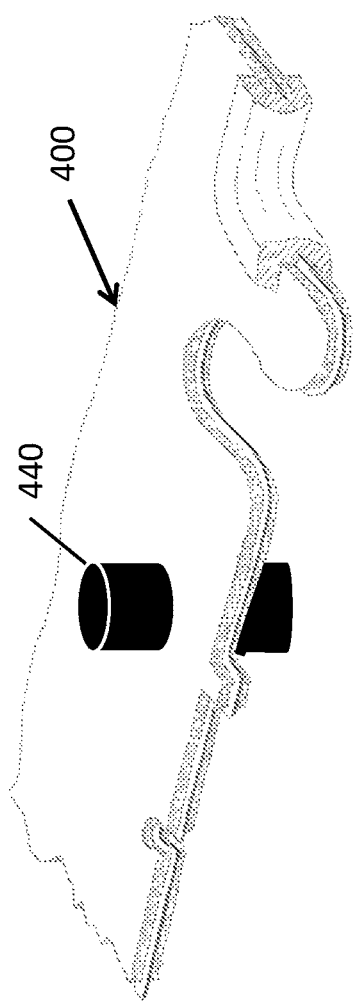
FIG. 6B shows an edge portion of the multilayer bus board with an additional plastic holding feature.

Referring now to FIGS. 6A and 6B there is shown a portion of the multilayer bus board 400 with two parallel extending conductive sheets 405, which are separated by an interposed dielectric sheet 410, which includes an end portion 411 extending outwards from the adjacent conductive sheets 405 and past the end portion 406 of the conductive sheets. The end portions 411 and 406 are disposed in parallel arrangement with the dielectric end portion 411 always extending outwards from the conductive sheet end portion 406. A molded plastic edge 430 of the overmold (not shown) extends over both conductive sheet end portions 406 and the dielectric end portion 411. In the process of molding the overmold frame which includes the molded plastic edge, the resin of the overmold frame is heated so that the thermoplastic can be molded to the desired shape. The conductive sheets, dielectric sheets, and the overmold frame expand and contract according to their coefficient of thermal expansion ("CTE"). The different CTE of each multilayer bus board component can result in "CTE mismatch" during heating and cooling of the multilayer bus board during operation of the multilayer bus board.

The multilayer bus board 400 can be designed to reduce the stresses caused by CTE by the inclusion of edge undulations such as mousebites 415, which are relatively small occlusions in the edges of both conductive sheets 405 and the interposed dielectric sheet 410, crenellations 420 which can be small in size but which extend outward from the multilayer bus board 400 and which generally are shaped with right angles, and large undulations 425 which are generally arcuately shaped and can comprise portions of the multilayer bus board which extend inwards or outwards relative the body of the multilayer bus board. Generally, for purposes of description in this Specification and the Claims the large undulations, crenellations and mousebites are referred to as edge undulations.

The molded plastic edge 430 can either follow the edge surface of an edge undulation such as a large undulation, or fill in and cover an edge undulation such as a relatively smaller mousebite or crenellation. However, all edge undulations act to relieve CTE mismatch related stress that can otherwise result in cracking of conductive sheet edge portions 406.

FIG. 6B shows the multilayer bus board 400 of FIG. 6A, but also includes a plastic feature interposed and extending through the multilayer bus board 400 to hold the multilayer bus board together and to eliminate the need for the overmold, or the need for the overmold to completely mechanically hold together the multilayer bus board. The plastic feature can comprise the same resin as the overmold or can be formed from another material. The size, location and material the plastic feature is made from depends on the multilayer bus board design, and what force is required to hold the multilayer bus board together. Topography, as will be detailed below, can be included in each plastic feature so as the locate components onto the multilayer bus board 400.

Referring now to FIGS. 7A and 7B, there is shown both a cross-sectional view of a prior art multilayer bus board 450 (FIG. 7A) and an embodiment of the multilayer bus board 470 of the present invention (FIG. 7B). The prior art multilayer bus board 450 comprises two copper sheets 451 with an interposed dielectric layer 452 and two outer dielectric layers 453. In FIG. 7A, the edges of the three dielectric layers are shown in a crimped arrangement at 455. The crimped arrangement requires additional width for the prior art multilayer bus board 450, and the two outer dielectric layers 453 insulate relative heat transfer as well as electricity transfer. Therefore, they impede heat dissipation which can negatively affect the multilayer bus board 450.

The multilayer bus board 470 of the present invention is shown in FIG. 7B with two conductive sheets 471 and 472 with an interposed dielectric sheet 473. Multilayer bus board 470 does not include any outer dielectric layers, and instead the outer surfaces 484 and 485 of the conductive sheets 471 and 472 respectively are not insulated and can more freely dissipate heat conducted through the conductive sheets 471 and 472. Outer surface 485 is scalloped or roughened to increase its surface area for heat conduction with the surrounding environment, which increases its ability to increase heat transfer and thus dissipate heat at a higher rate. In one aspect, the outer surface 485 can also be coated with a carbon which can be plasma sprayed or otherwise applied to also increase the ability of outer surface 485 to increase surface emissivity and thus increase heat dissipation through heat radiation.

The end 481 of the multilayer bus board 470 shows a molded plastic edge 480 surrounding the edge of both conductive sheets 471 and 472 and the dielectric sheet 473. The molded plastic edge 480 encapsulates the edge portion 482 of the dielectric sheet 473. The molded plastic edge 480 reduces the package width of the multilayer bus board 470 relative multilayer bus board 450, which is an advantage of the present invention relative the prior art.

Although the molded plastic edge encapsulates and secures the end of the multilayer bus board 470, its adhesion to the end surfaces 475 of the conductive sheets 471 and 472 and the dielectric sheet 473 can be improved by surface treatment of the end surfaces with an adhesive such as a silanes. Such adhesive treatment is known to enhance polymer metal adhesion in injection molding operations. An example of such an adhesive is a silane such as diamino-functional silane which can act as a coupling agent between the metal conductive sheets 471 and 472 and the polymer of the molded plastic edge 480, but should in no way be limiting as other adhesives known to those skilled in the art which show utility in promoting adhesion can be also alternatively included.

Figure 8:
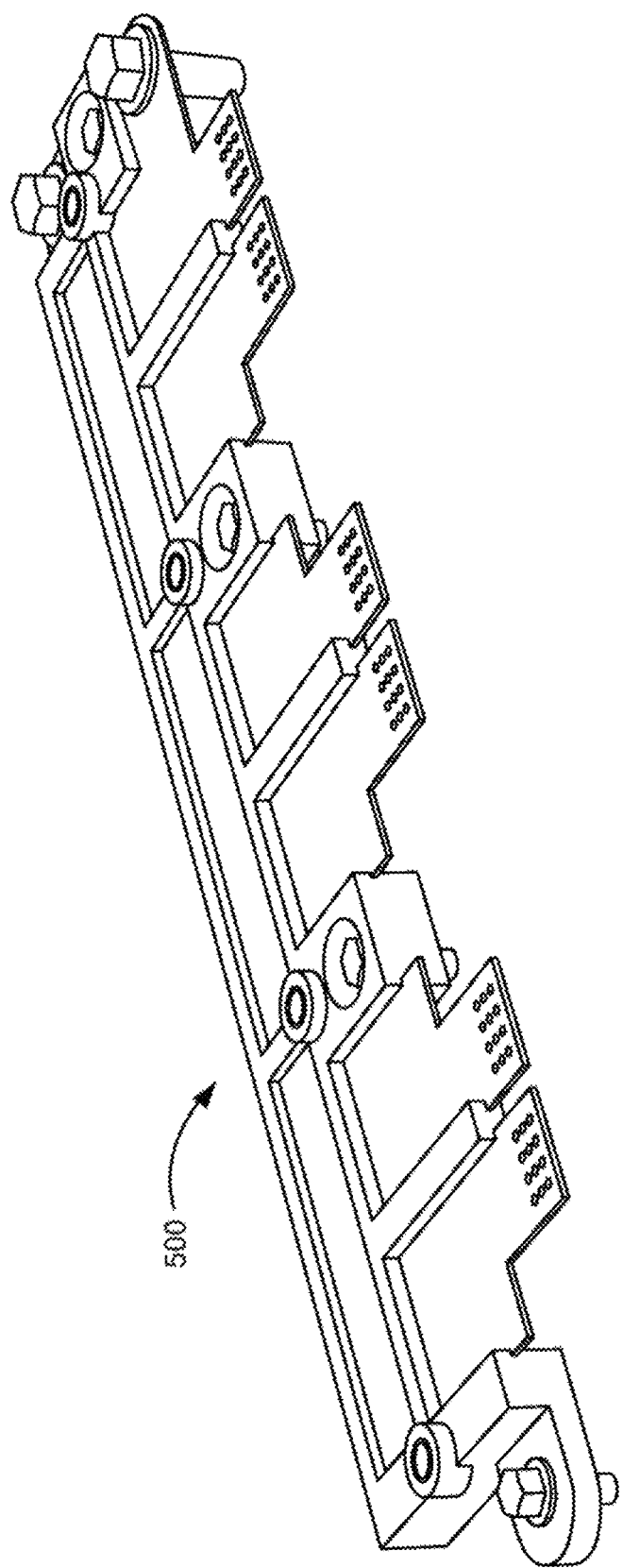
FIG. 8 shows a perspective view of the topography of the molded frame of the bus board.

Referring to FIG. 8, there is shown a portion of the overmold 500 of the multilayer bus board of the present invention which includes topography and molded features. Such topography extends in three dimensions and includes integrated features such as standoffs, locating features, bolt to features and edge definements which are secondary add-on features in prior art laminated bus boards, are described here as topography features of the overmold of the multilayer bus board 500 of the present invention. Such topography allows for locating, nesting and mounting of subassemblies and components to the multilayer bus board 500. The topography is molded as a portion of the overmold and can extend therefrom.

Figure 9:
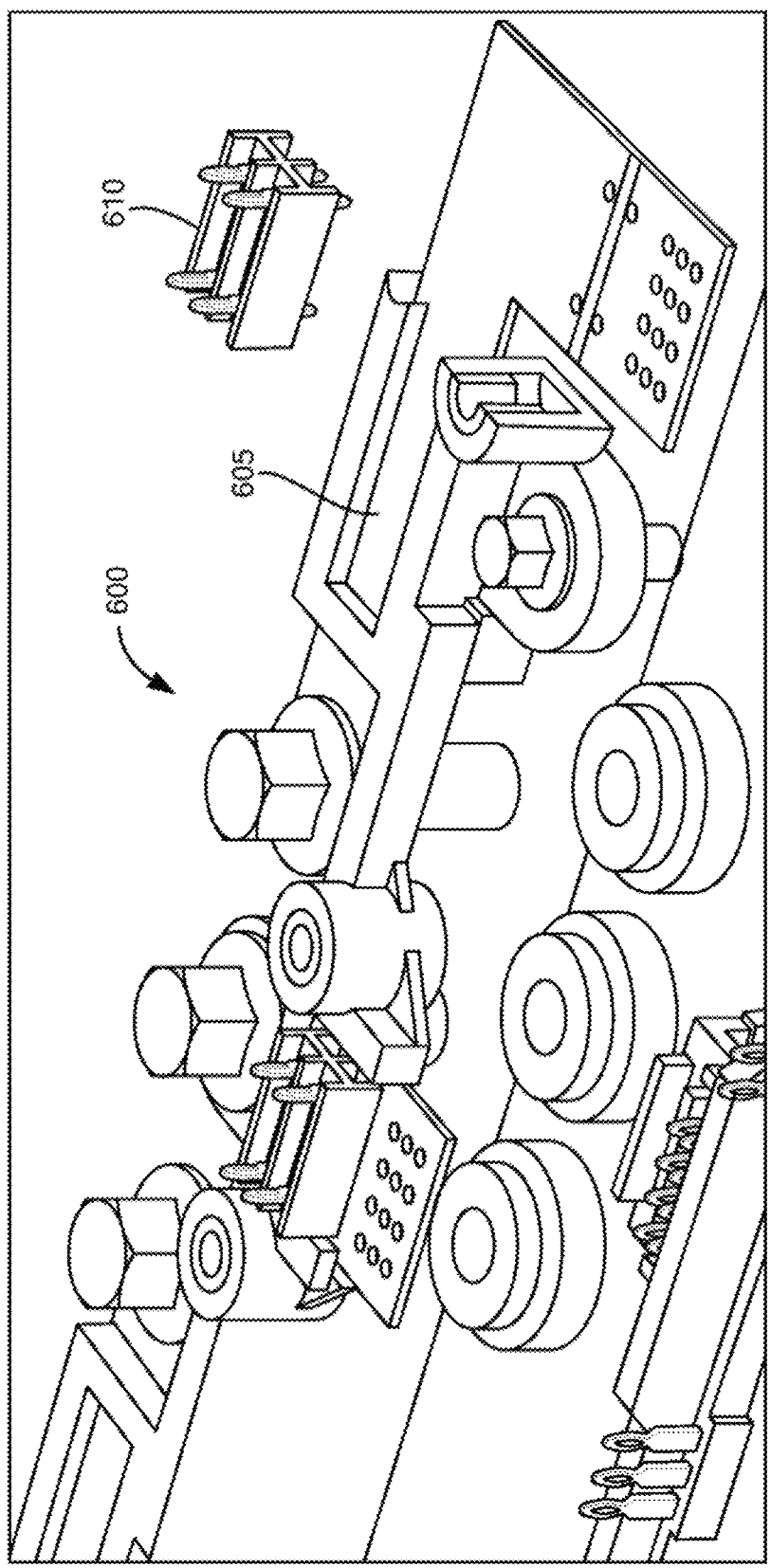
FIG. 9 shows another perspective view of the topography of the molded bus board, with an inset view showing an integrated component example.

The described topography of the dielectric overmold can accommodate the integration of subcomponents directly into the multilayer bus board. Referring to FIG. 9 there is shown a multilayer bus board with molded topography 600 having a hole 605 for the location and electrical integration of an integrated current sensor 610. Although the electrical integration of a current sensor is detailed in both FIG. 10, this mechanical arrangement of the multilayer bus board allows for the location and integration of other such desired subcomponents onto the multilayer bus board. This illustrative example should in no way be considered limiting and subcomponents can include any useful electrical components such as thermistors, diodes, resistors, capacitors, etc.

Figure 10:
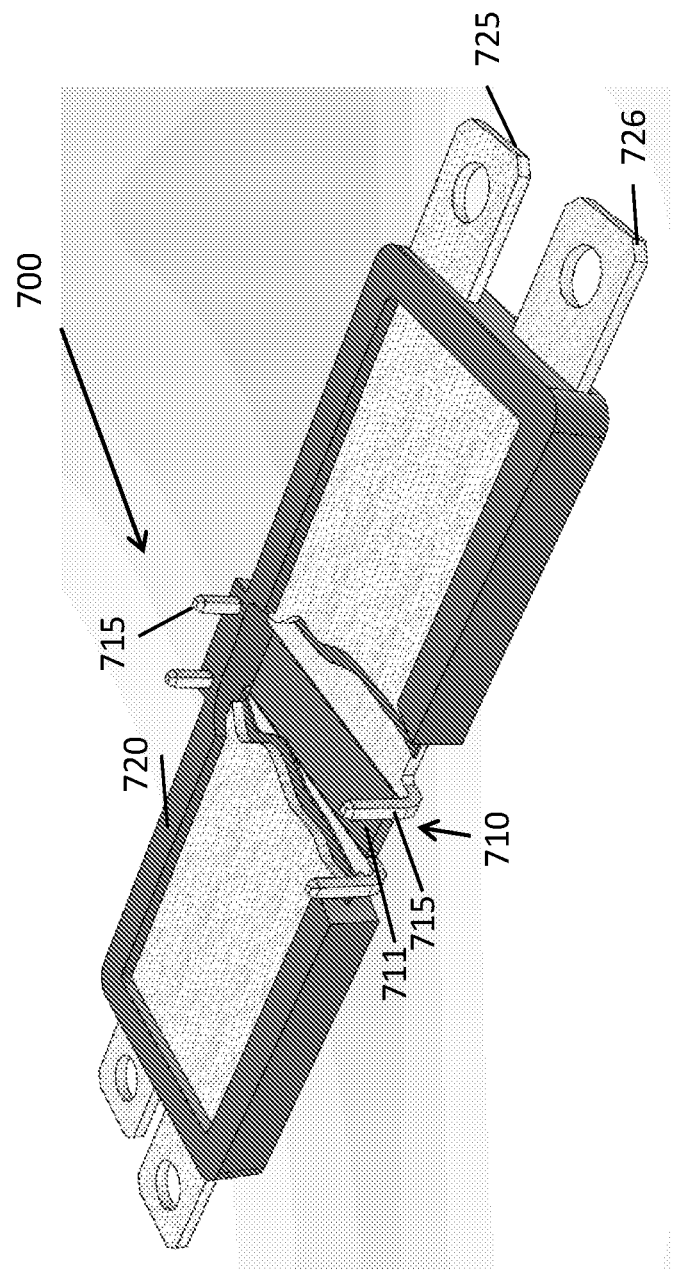
FIG. 10 shows a perspective view of an integrated component with a cut-away portion.

Referring to FIG. 10, there is shown a multilayer bus board 700 with a portion cut-away to display an integrated current sensor component 710. The current sensor 710 includes a resistive metal strip 711 which possesses a known resistance, which is placed in series with the load of the multilayer bus board. The voltage drop, which can be measured across pins 715 which are electrically connected across the resistive metal 711, is proportional to the current flow through the multilayer bus board 700. The pins can be connected to a programmable circuit board ("PCB") for monitoring the voltage change. The multilayer bus board 700 includes an overmold 720 which has appropriate penetrations for terminals 720 and 726 which extend from and are in electrical communication with conducting sheets (not shown) within the multilayer bus board 700.

Figure 11:
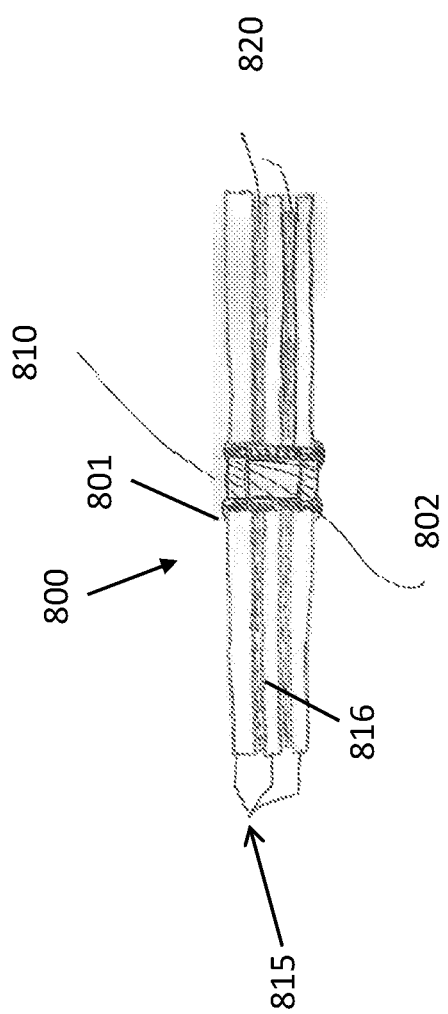
FIG. 11 shows a perspective view of the topography of the molded multilayer bus board.

Referring to FIG. 11, there is shown a generic integrated component 810, mounted within a hole 801 formed within the multilayer bus board 800. The hole is insulated by a molded dielectric sleeve 802, which is a portion of and extension of the overmold (not shown). The conductive bus bar layers or sheets 815 are separated from each other by alternating and interposed dielectric sheets 820. The conductive sheets include a center bus 816, which is insulated from the component 810 in the hole 801 by the molded dielectric insulator 802 which also locates and secures the component within the hole. The mounting and embedding of an electrical component into the hole 801 is simplified by the design of the multilayer bus board and these holes can act to integrate live components onto the buss, thus moving all inductance to the bus board, leaving data components for the PCB.

Figure 12:
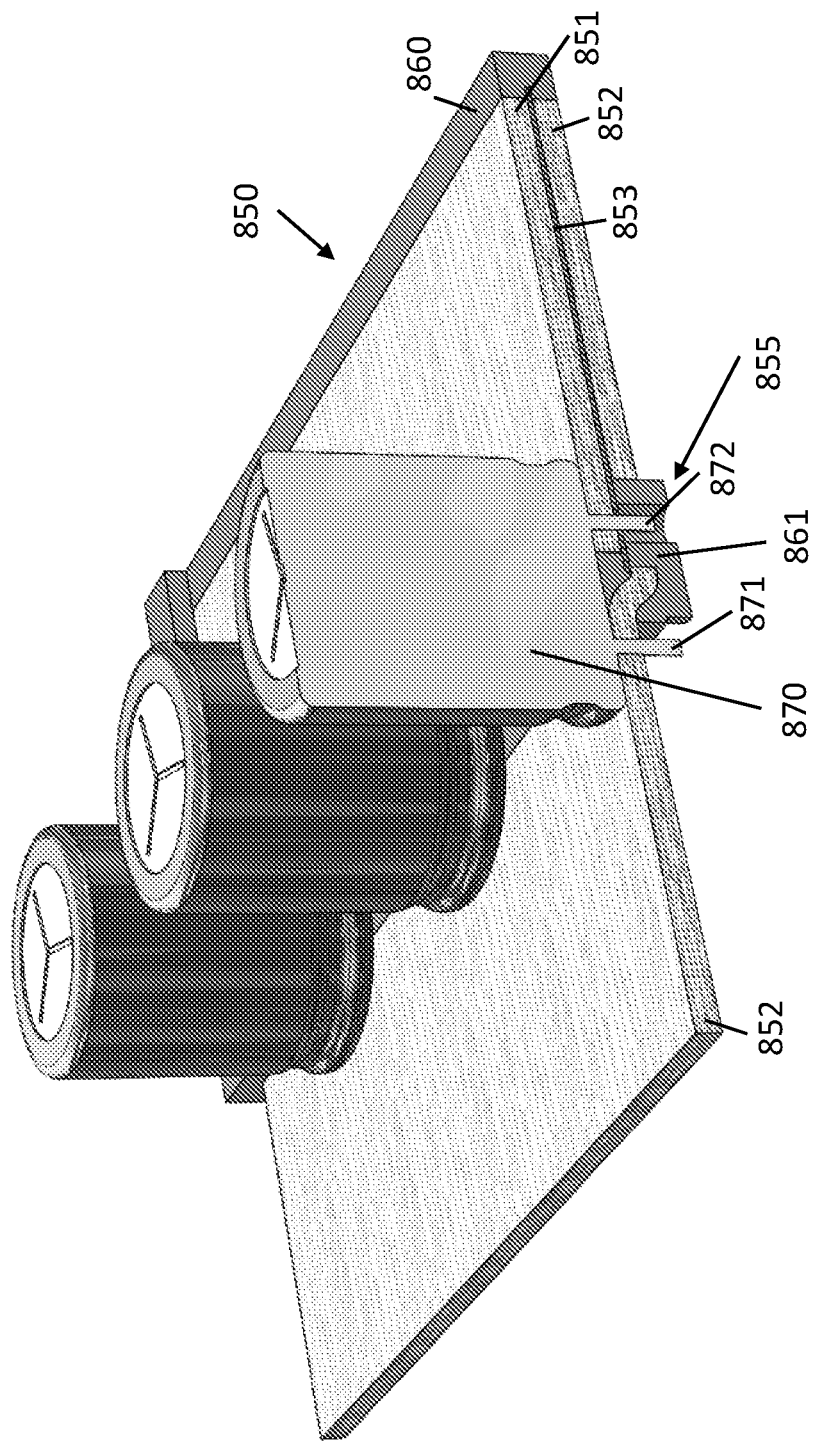
FIG. 12 shows another perspective view of an integrated component with a cut-away portion.

Referring to FIG. 12, there is shown an integrated component 870, mounted within a hole 855 formed within the multilayer bus board 850. The hole is insulated by a molded dielectric insulator 861, which is a portion of the overmold 860. The conductive bus bar layers or sheets 851 and 852 are separated from each other by interposed dielectric sheet 853. The component 870 has a first lead 871 which makes conductive contact with conductive sheet 852, but which is insulated from conductive sheet 851 by the molded dielectric insulator 861. A second lead 872 makes conductive contact with conductive sheet 851 but is similarly insulated from conductive sheet 852 by the molded dielectric insulator 861. Thus the hole 855 allows for the location and integration of an electrical component onto the multilayer bus board 850 of the present invention. The hole accommodates the mounting of multiple components, and facilitates the electrical communication of the leads of each component with two different layers of the multilayer bus board.

Figure 13:
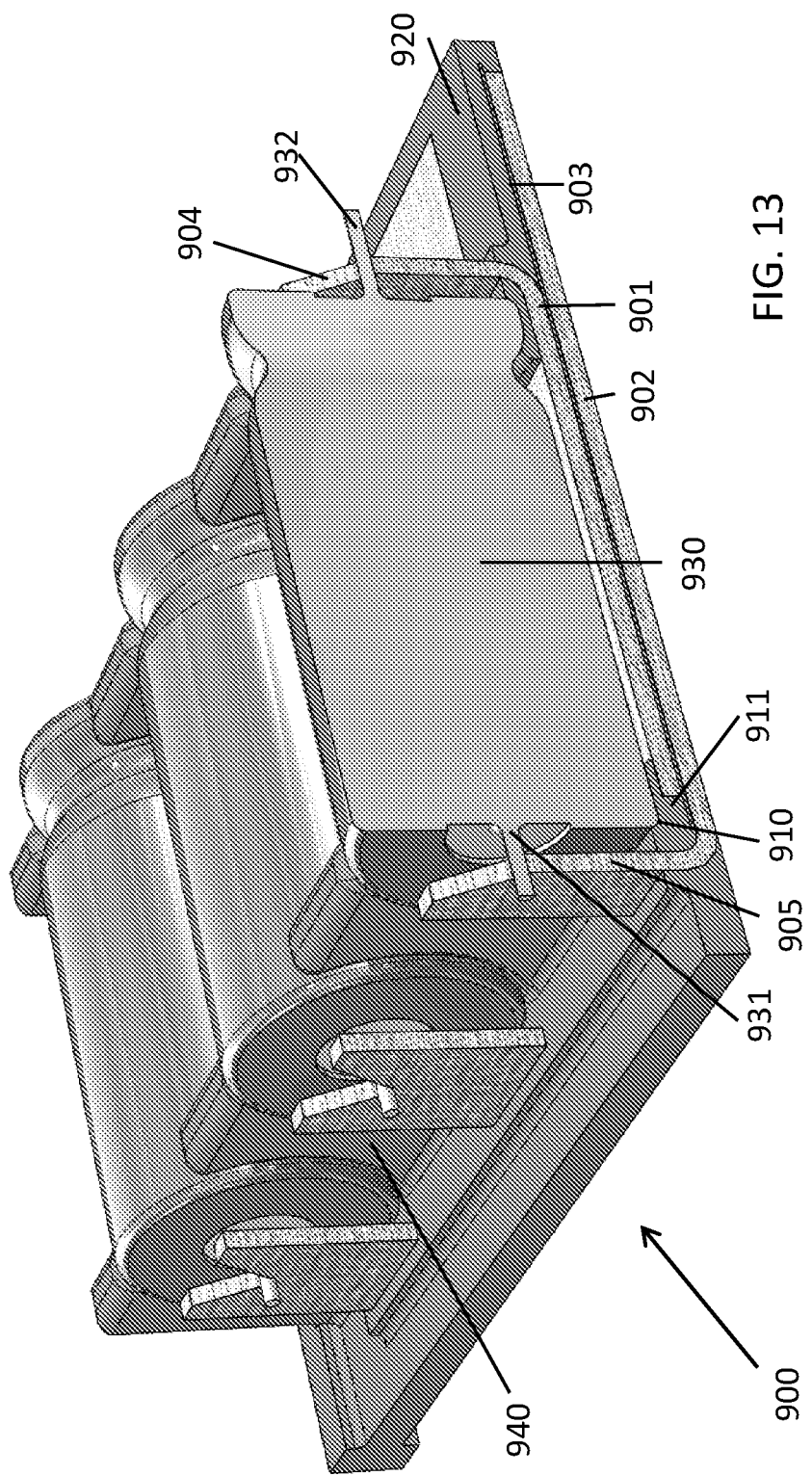
FIG. 13 shows another perspective view of an integrated component with a cut-away portion.

Referring to FIG. 13, there is shown an integrated component 930, mounted within a hole 910 formed within the multilayer bus board 900. The hole is insulated by a molded dielectric insulator 911, which is a portion of the overmold 920. The conductive bus bar layers or sheets 901 and 902 are separated from each other by interposed dielectric sheet 903. The component 930 has a first lead 931 which makes conductive contact with conductive sheet 902 via an outwardly extending lead 905. A second lead 904 is electrically connected to outwardly extending lead 904 which is in electrical connection with conductive sheet 901. The hole 910 also includes locating topography 940 which is also an extension and portion of the overmold 920 to act as a locator and holder of the integrated components. Although the leads are show as in spring contact, alternative electrical communication means such as a weld, rivet, adhesive or other secure connection allows integration of an electrical component onto the multilayer bus board 900 of the present invention.

Figure 14:
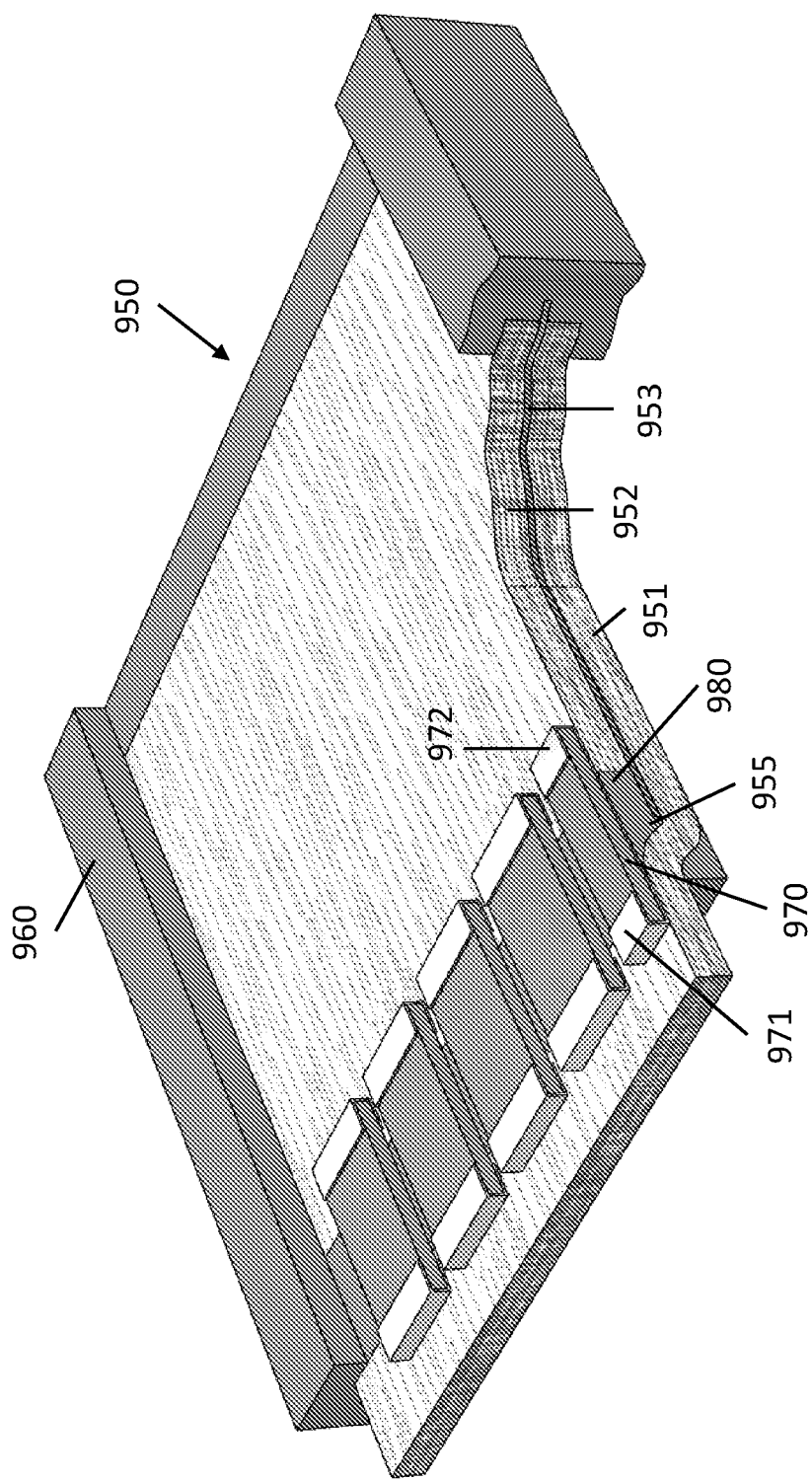
FIG. 14 shows another perspective view of an integrated component with a cut-away portion.

Referring to FIG. 14, there is shown a multilayer bus board 950 with a portion cut-away to display an integrated channel 980, with multiple electrical components 970 mounted thereon. In this embodiment, the multilayer bus board 950 includes a first and second conductive sheet 951 and 952, with an interposed dielectric sheet 953 extending therebetween. The channel 980 is arranged for accommodation of surface mounted components, and dielectric layer 955 extends across the hole as a portion and extension of the overmold 960. The dielectric layer 955 cooperates with the dielectric sheet 953 to electrically insulate conductive sheet 951 from conductive sheet 952. The component 970 includes both a first and second lead 971 and 972 which are disposed at each end of the component. The first lead 971 making electrical connection with conductive sheet 951 and the second lead 972 making electrical connection with conductive sheet 952. Thus the molded dielectric 955 and 960 can accommodate the integration of subcomponents directly into the multilayer bus board 950. In this embodiment the component is mounted into the surface of the multilayer bus board 950, with each lead of the component mounted and connected to a separate conductive layer of the multilayer bus board 950.

Figure 15:
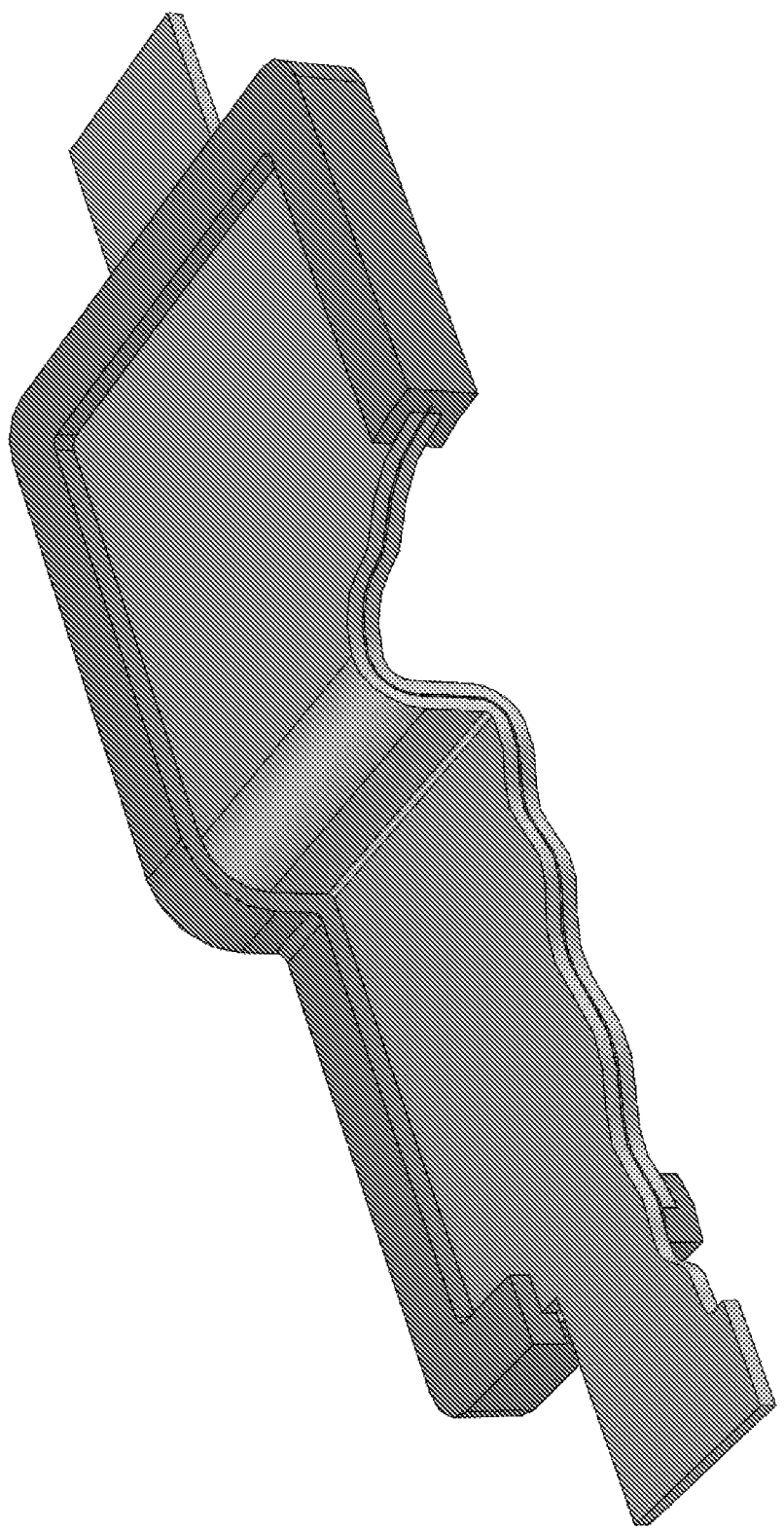
FIG. 15 shows perspective views of folded and curved molded multilayer bus board assemblies in accordance with the present invention.

A bus board in accordance with the present invention may also be provided as a folded and/or curved bus board which may be advantageous in various packaging applications. An exemplary embodiment that is both folded and curved is illustrated in FIG. 15 Various degrees of curvature of the molded bus board may be provided to accommodate specific packaging requirements.

Furthermore, while the conductive layers may be formed as a single conductive substrate or plane, they may also be provided in the form of a flex circuit that includes plural conductive traces or planes on the same layer of the multilayer stacked assembly. More specifically, the flex circuits may include signal or power paths, multiple power planes, or combinations thereof. Furthermore, one or more of the layers may include multiple conductive paths or planes which are not integrated within a flex circuit. Layers including conductive paths or planes have dielectric layers provided on either side thereof to prevent shorting to conductive paths or planes on an adjacent layer, except for outer layers including conductive paths or planes which may optionally include a dielectric layer as the most outermost layer of the multilayer stacked assembly.

As noted above, each bus board layer may include more than one conductive trace or plane. The pre-stamped traces and/or planes may include tie bars that maintain the alignment of the traces or planes within the respective layer. The pre-stamped layer may be included in the multilayer stack and the frame then molded over the multilayer stacked assembly. Following molding of the frame the tie bars may be drilled or stamped to create the independent electrical circuits on the respective layer. More specifically, holes in conductive paths or planes on different layers of the bus board may be sized such that upon insertion of the resistive wire therethrough, the resistive wire makes conductive contact with the respective paths or planes on the different layers. Other paths or planes that are not dielectric layers either have oversized openings surrounding the through hole for the resistive wire so that the resistive wire does not make conductive contact on the respective layer or conductive material is not provided in the vicinity of the through hole on the layer for which no conductive connection is desired.

The molded sleeve may be provided in any layer of the stacked assembly. As discussed above, when the sleeve is in the outer or outermost layers of multilayer stacked assembly, an oversized opening may be provided in such layers to permit the molding of the sleeve with the frame. If the sleeve is to be provided in one of the inner layers, a passage for the molten plastic is provided through the conductive and dielectric layers to permit the flow of plastic to the void in which the sleeve is to be formed. Mold tooling may be employed as is known in the art, such as a pin extending through the multilayer stacked assembly, to prevent the flow of plastic into the central portion of the void in which the sleeve is formed. Alternatively, the through hole may be drilled or redrilled after the molding process to remove plastic from the through hole through which the conductive contact will pass.

While the invention has been described in detail herein in accordance with certain preferred embodiments thereof, many modifications and changes therein may be affected by those skilled in the art without departing from the spirit of the invention. Accordingly, it is our intent to be limited only by the scope of the appending claims and not by way of the details and instrumentalities describing the embodiments shown herein.

What is claimed is:

1. A multilayer bus board comprising:
   a multilayer stacked assembly having a plurality of layers including a pair of electrically conductive layers and a dielectric layer disposed between and adjoining each of the conductive layers; and
   a molded frame formed of an insulating polymer material, the frame having a peripheral portion encapsulating end portions of the dielectric layer and the conductive layers to maintain the conductive layers and the dielectric layer in position relative to each other, the frame defining an enlarged opening through which an external surface of an outer one of the layers is exposed.

2. The multilayer bus board of claim 1, wherein the layers are mechanically held together by the frame and are not secured to each other by adhesive, lamination or other type of bonding.

3. The multilayer bus board of claim 1, wherein electricity flows through each of the conductive layers, and wherein each of the conductive layers has a width and thickness, and wherein the thickness ranges from 0.25 mm to 0.6 mm and the ratio of width to thickness is greater than 200:1.

4. The multilayer bus board of claim 1, wherein electricity flows through the conductive layers in opposite directions and wherein the conductive layers are positioned less than 0.3 mm apart from each other.

5. The multilayer bus board of claim 1, wherein the multilayer stack assembly periphery comprises nonlinear undulations, wherein said frame covers at least a portion of the nonlinear undulations.

6. The multilayer bus board of claim 1, wherein the outer one of the layers is one of the conductive layers, and wherein the outer one of the layers has an internal surface adjoining the dielectric layer.

7. The multilayer bus board of claim 6, wherein the external surface of the outer one of the layers is surface treated to increase heat dissipation.

8. The multilayer bus board of claim 1, wherein the outer one of the layers is a first one of the conductive layers, wherein a second one of the conductive layers is bent to form an exposed portion, and wherein the multilayer bus board further comprises an electrical component having first and second leads, the first lead being electrically connected to the first one of the conductive layers and the second lead being electrically connected to the exposed portion of the second one of the conductive layers.

9. The multilayer bus board of claim 8, wherein the first one of the conductive layers is bent to form a first contact portion extending outwardly from the multilayer stacked assembly, wherein the exposed portion of the second one of the conductive layers is a second contact portion extending outwardly from the multilayer stacked assembly, and wherein the first lead of the electrical component is electrically connected to the first contact portion of the first one of the conductive layers and the second lead of the electrical component is electrically connected to the second contact portion of the second one of the conductive layers.

10. The multilayer bus board of claim 8, wherein the exposed portion of the second one of the conductive layers is coplanar with the first one of the conductive layers, and wherein the first lead of the electrical component physically contacts the external surface of the outer one of the layers.

11. The multilayer bus board of claim 1, wherein a plurality of aligned holes extend through a plurality of the layers, and wherein the frame includes a dielectric insulator disposed within at least a first one of the aligned holes.

12. The multilayer bus board of claim 11, wherein the first one of the aligned holes extends through a first one of the conductive layers and a second one of the aligned holes extends through a second one of the conductive layers, and wherein the dielectric insulator is a dielectric sleeve having an opening extending therethrough.

13. The multilayer bus board of claim 12, wherein the dielectric sleeve is joined to the peripheral portion of the frame by one or more legs.

14. The multilayer bus board of claim 12, wherein the multilayer bus board further comprises an electrical component mounted to the multilayer stacked assembly, wherein the electrical component is insulated by the dielectric sleeve from the first one of the conductive layers.

15. The multilayer bus board of claim 14, wherein the dielectric sleeve is also disposed within the second one of the aligned holes, and wherein the electrical component is disposed inside the dielectric sleeve so as to be insulated by the dielectric insulator from both the first and second ones of the conductive layers.

16. The multilayer bus board of claim 14, wherein the electrical component is electrically connected to the second one of the conductive layers.

17. The multilayer bus board of claim 16, wherein the electrical component is a conductive contact that extends through the dielectric sleeve and is disposed in the second one of the aligned holes so as to be in electrical mating interconnection with the second one of the conductive layers.

18. The multilayer bus board of claim 11, wherein the multilayer bus board further comprises an electrical component mounted to the multilayer stacked assembly, the electrical component comprising two contact leads, one of the contact leads being electrically connected to the first one of the conductive layers and being insulated by the dielectric insulator from the second one of the conductive layers, while the other one of the contact leads being electrically connected to the second one of the conductive layers and being insulated by the dielectric insulator from the first one of the conductive layers.

19. The multilayer bus board of claim 18, wherein said electrical component is selected from a group comprising: an ammeter shunt, thermistor, diode, sensor, current sensor, resistor, capacitor and combinations thereof.

20. An electrical assembly comprising the multi-layer bus board of claim 1, wherein the peripheral portion of the frame of the multilayer bus board has a plurality of mounting holes, and wherein the electrical assembly further comprises:
   bushings disposed in the mounting holes, respectively, the bushings having flanges, respectively; and
   a circuit board mounted to the multilayer bus board by fasteners extending through the bushings, the circuit board being spaced from the outer one of the layers of the multilayer stacked assembly by the flanges of the bushings.

* * * * *